United States Patent
Wu et al.

(10) Patent No.: US 7,790,498 B2
(45) Date of Patent: Sep. 7, 2010

(54) PROCESS USING A BROKEN GELLED COMPOSITION

(75) Inventors: Yiliang Wu, Mississauga (CA); Beng S. Ong, Mississauga (CA)

(73) Assignee: Xerox Corporation, Norwalk, CT (US)

( * ) Notice: Subject to any disclaimer, the term of this patent is extended or adjusted under 35 U.S.C. 154(b) by 558 days.

(21) Appl. No.: 11/406,619

(22) Filed: Apr. 19, 2006

(65) Prior Publication Data

US 2007/0249181 A1 Oct. 25, 2007

(51) Int. Cl.
*H01L 51/40* (2006.01)
(52) U.S. Cl. .............. 438/99; 257/40; 438/780
(58) Field of Classification Search ............. 257/40; 438/99, 780
See application file for complete search history.

(56) References Cited

U.S. PATENT DOCUMENTS 6,211,274 B1 * 4/2001 Tanegashima et al. ....... 524/399
6,803,262 B2 10/2004 Wu et al.
6,890,868 B2 5/2005 Wu et al.
2004/0075120 A1 * 4/2004 Wu et al. ................ 257/288

OTHER PUBLICATIONS

Beng Ong et al., "Design of High-Performance Regioregular Polythiophenes for Organic Thin-Film Transistors" *Proceedings of the IEEE*, vol. 93, No. 8., pp. 1412-1419 (Aug. 2005).

* cited by examiner

*Primary Examiner*—Eugene Lee
*Assistant Examiner*—Anthony Ho
(74) *Attorney, Agent, or Firm*—Fay Sharpe LLP

(57) ABSTRACT

A process including: (a) providing a gelable composition comprising a gelable semiconductor polymer and a liquid, wherein the polymer is at a low concentration in the liquid; (b) gelling the gelable composition to result in a gelled composition; (c) breaking the gelled composition to result in a flowable, broken gelled composition, wherein the viscosity of the flowable, broken gelled composition is at least about 10 times greater than the viscosity of the liquid; and (d) liquid depositing the flowable, broken gelled composition.

18 Claims, 2 Drawing Sheets

PROCESS USING A BROKEN GELLED COMPOSITION

STATEMENT REGARDING FEDERALLY SPONSORED RESEARCH OR DEVELOPMENT

This invention was made with United States Government support under Cooperative Agreement No. 70NANBOH3033 awarded by the National Institute of Standards and Technology (NIST). The United States Government has certain rights in the invention.

BACKGROUND OF THE INVENTION

Polymer thin film transistors have potential applications for fabricating low-cost integrated circuits for large-area/low-end electronic devices such as active matrix liquid crystal displays, electronic paper, smart cards, radio frequency identification tags, and the like. They have the added advantages of being mechanically durable and compatible with flexible substrates, thus offering the potential of fabricating structurally flexible electronic devices. Two critical requirements for these low-cost applications are sufficient charge carrier mobility and liquid processability. Higher charge carrier mobility can be achieved through enabling material design and process innovation as disclosed in Beng Ong et al., "Design of High-Performance Regioregular Polythiophenes for Organic Thin-Film Transistors" *Proceedings of the IEEE*, Vol. 93, No. 8., pp. 1412-1419 (August 2005), Yiliang Wu et al., U.S. Pat. No. 6,803,262, and Yiliang Wu et al., U.S. Pat. No. 6,890,868. Liquid processability of materials at room temperature or other temperatures slightly above room temperature is generally advantageous due to the lower energy requirement and the simplification in equipment.

The semiconductor layer in organic thin-film transistors (OTFTs) is preferred to be thin such as less than about 500 nm, particularly less than about 100 nm, preferably about 50 nm. A thick film may result in high off-current due to the intrinsic conductivity of the semiconductor layer. In order to achieve a thin semiconductor layer, a low concentration of the semiconductor in a proper liquid vehicle is usually used. For example, the concentration is usually less than 5 wt %, particularly less than 1 wt %. On the other hand, the low concentration of the semiconductor usually causes the composition (semiconductor and liquid) to exhibit a low viscosity, typically just a slightly higher than the viscosity of the liquid vehicle. The low viscosity causes problems during deposition, for example, coffee ring effect during printing, flying away during spin coating. These problems are more pronounced on a hydrophobic surface which is usually required for OTFTs. As a result, the semiconductor layer is not uniform, thus device performance is poor and has large variation. Therefore, there is a need to form a semiconductor composition with a high viscosity while retaining a low concentration of the semiconductor.

SUMMARY OF THE DISCLOSURE

There is disclosed in embodiments a process comprising:
(a) providing a gelable composition comprising a gelable semiconductor polymer and a liquid, wherein the polymer is at a low concentration in the liquid;
(b) gelling the gelable composition to result in a gelled composition;
(c) breaking the gelled composition to result in a flowable, broken gelled composition, wherein the viscosity of the flowable, broken gelled composition is at least about 10 times greater than the viscosity of the liquid; and
(d) liquid depositing the flowable, broken gelled composition.

In further embodiments, there is disclosed a process to fabricate a semiconductor layer comprising:
(a) liquid depositing a layer of a flowable, broken gelled composition comprising a gelable semiconductor polymer and a liquid, wherein the polymer is at a low concentration in the liquid, and wherein the viscosity of the flowable, broken gelled composition is at least about 10 times greater than the viscosity of the liquid; and
(b) drying the deposited layer to result in the semiconductor layer.

In additional embodiments, there is provided a flowable, broken gelled composition comprising a gelable semiconductor polymer and a liquid, wherein the polymer is at a low concentration in the liquid, wherein the viscosity of the flowable, broken gelled composition is at least about 10 times greater than the viscosity of the liquid.

BRIEF DESCRIPTION OF THE DRAWINGS

Other aspects of the present invention will become apparent as the following description proceeds and upon reference to the following figures which represent illustrative embodiments.

Unless otherwise noted, the same reference numeral in different Figures refers to the same or similar feature.

DETAILED DESCRIPTION

Figure 1:
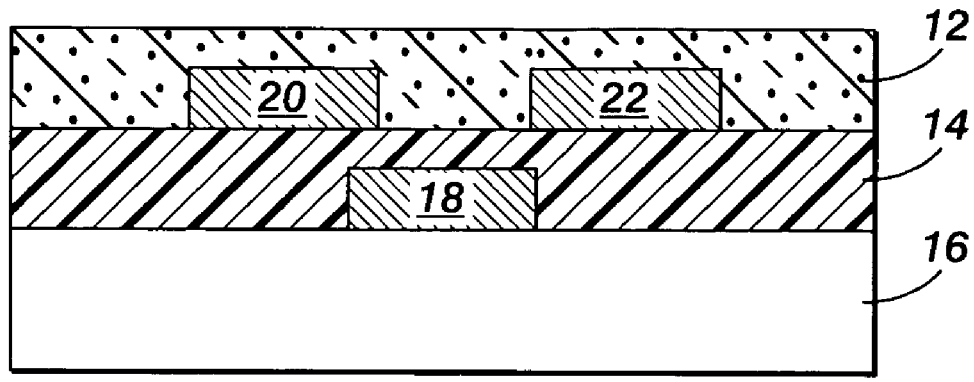
FIG. 1 represents a first embodiment of an OTFT made using the present process.

In embodiments, this invention involves forming a flowable, broken gelled composition from a gelable composition comprising a gelable semiconductor polymer at a low concentration in a liquid, wherein the viscosity of the flowable, broken gelled composition is at least about 10 times greater than the viscosity of the liquid used in the gelable composition. In embodiments, the present invention involves liquid depositing and drying the flowable, broken gelled composition to form a semiconductor layer of an electronic device.

The terms "gelling," "gelled," and "gel" refer to formation of a three-dimensional polymer network of a polymer in a liquid through intermolecular interaction such as hydrogen bonding, van der Waals interactions, while the liquid is adsorbed in the three-dimensional network. Gel is not flowable. Therefore it is impractical to liquid deposit a gel into a uniform thin film. In the present process, the phrase "gelling the gelable composition to result in a gelled composition" indicates extensive gelling in the gelled composition. The gelling in the present gelled composition is more extensive than in the composition described in Yiliang Wu et al., U.S. Pat. No. 6,890,868, wherein "visibly observable gelled material may exist despite the agitation" (see column 6, lines 44-45). This difference in the extent of gelling is reflected in that the present gelled composition is typically not flowable (due to its high viscosity), whereas the composition in Yiliang Wu et al., U.S. Pat. No. 6,890,868, which is described as being subjected to agitation to disrupt gelling, has a lower viscosity which makes it flowable despite the possible presence of some gelled material.

Any semiconductor polymer which is capable of gelling (that is, a gelable semiconductor polymer) may be used in the present invention. The terms "gelable" and "capable of gelling" refer to situations when gelling can occur when the gelable composition including the gelable semiconductor polymer and a liquid is subjected to gel-producing processing (such as for example a temperature change and/or addition of a different liquid). This gelling is referred to as physical gelling as no covalent bonding typically occurs. In the absence of agitation, such gelling typically occurs in a timeframe ranging for example from about 5 seconds to about 1 week, especially from about 1 minute to about 1 day.

In embodiments, the gelable composition used in the present process may be for instance a broken gelled composition (that is, a gelled composition where the gel has been broken) or a non-gelled composition (that is, a composition which has not been subjected to gel formation and then gel breakdown). In a broken gelled composition, as seen by the naked eye, gelled material may be totally absent or some gelled material may still exist in the form of small gels.

The gelable semiconductor polymers are for example polythiophenes, triarylamine polymers, polyindolocarbazoles, and the like. Polythiophenes include for examples both regioregular and regiorandom poly(3-alkylthiophene)s, polythiophenes comprising substituted and unsubstituted thienylene group, polythiophenes comprising optionally substituted thieno[3,2-b]thiophene and/or optionally substituted thieno[2,3-b]thiophene group, and polythiophenes comprising non-thiophene based aromatic groups such as phenylene, fluorene, furan, and the like.

Not all semiconductor polymers are gelable. It is understood that the classes of gelable semiconductive polymers mentioned herein are illustrative and that whether a particular semiconductor polymer within a described class is gelable can be verified by subjecting the semiconductive polymer to a gel-producing process such as those described herein.

In embodiments, a gelable semiconductor polymer may possess the following characteristics (it is possible that a semiconductor polymer is gelable despite not possessing one or more of these characteristics): (1) the polymer has a conjugated backbone; (2) the polymer has side chains, which are preferable arranged in a parallel manner, containing at least 8 atoms, especially at least 12 atoms in length; and (3) the distance between two adjacent side chains at the same side of the polymer backbone is from about 7.5 Å to about 20 Å, especially from about 8 to 15 Å. To further illustrate the characteristics, an example is given below of a class of a gelable semiconductor polymer:

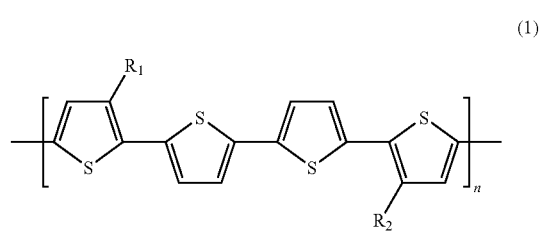

(1)

wherein $R_1$ and $R_2$, which are the same or different from each other, are selected from the group consisting of a hydrocarbon group and a heteroatom-containing group, and n is the degree of polymerization (such as for example 2 to about 200).

In embodiments, the gelable semiconductor polymer of structure (1) has a conjugated backbone composed of thiophene moieties. The side chains, $R_1$ and $R_2$, are arranged in a parallel manner. When we draw several monomeric units together as shown in structure (1A) (wherein $R_1=R_2=C_{12}H_{25}$), we can see that the adjacent two side chains at the same side of the polymer backbone have a calculated distance about 12 Å. This distance allows other side chains coming in to form an interdigitation structure.

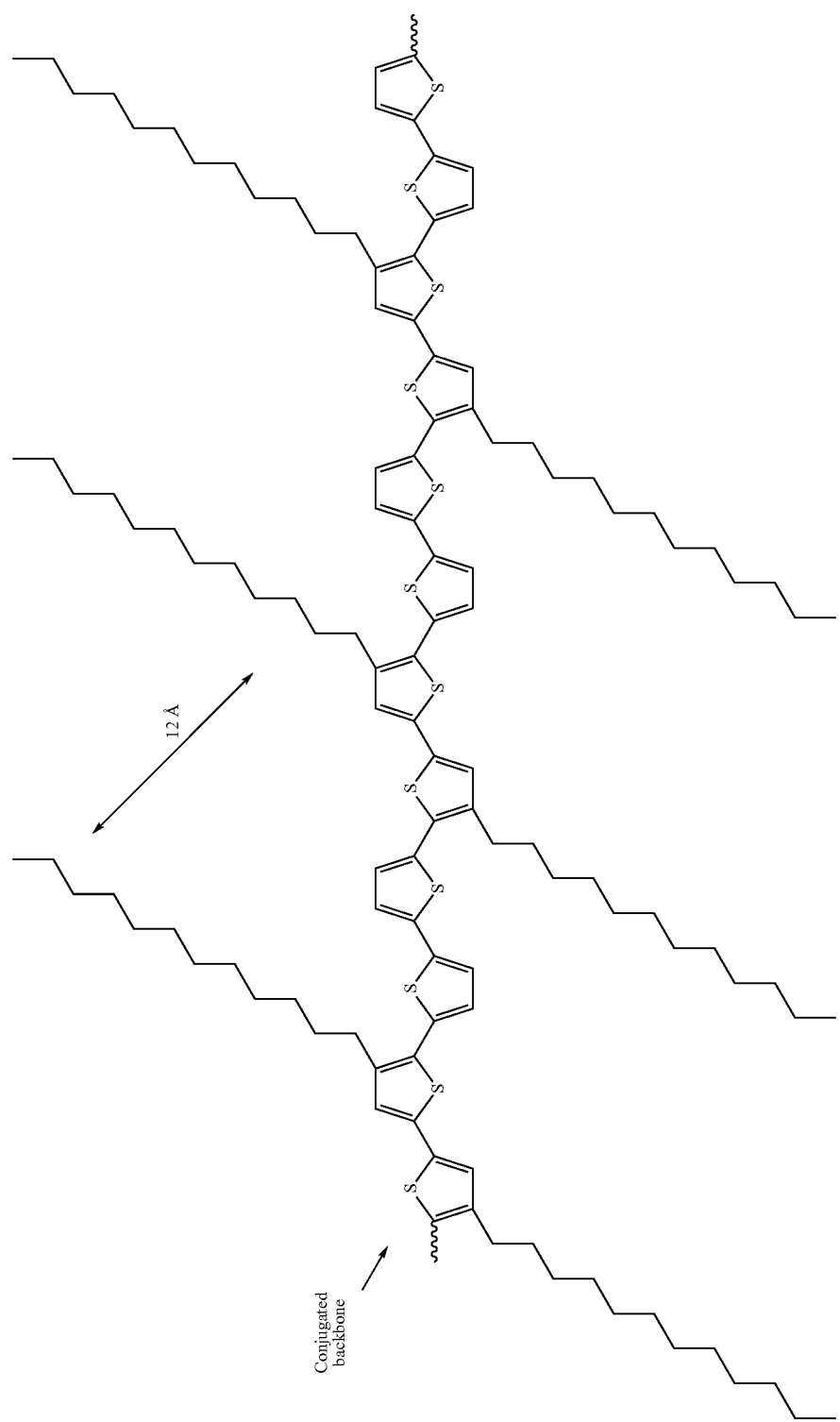

-continued
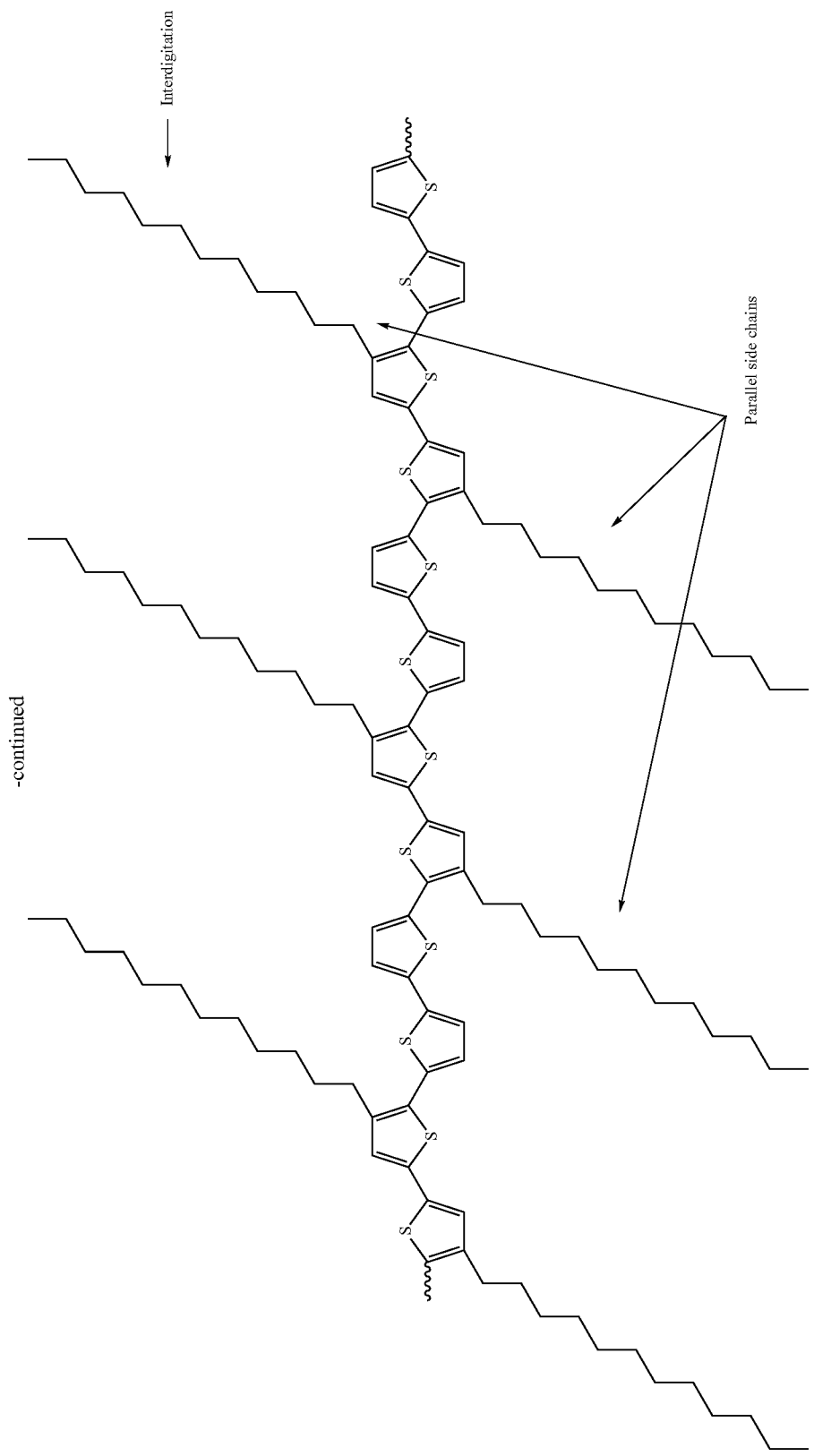

Other classes of gelable semiconductor polymers are illustrated as follows:

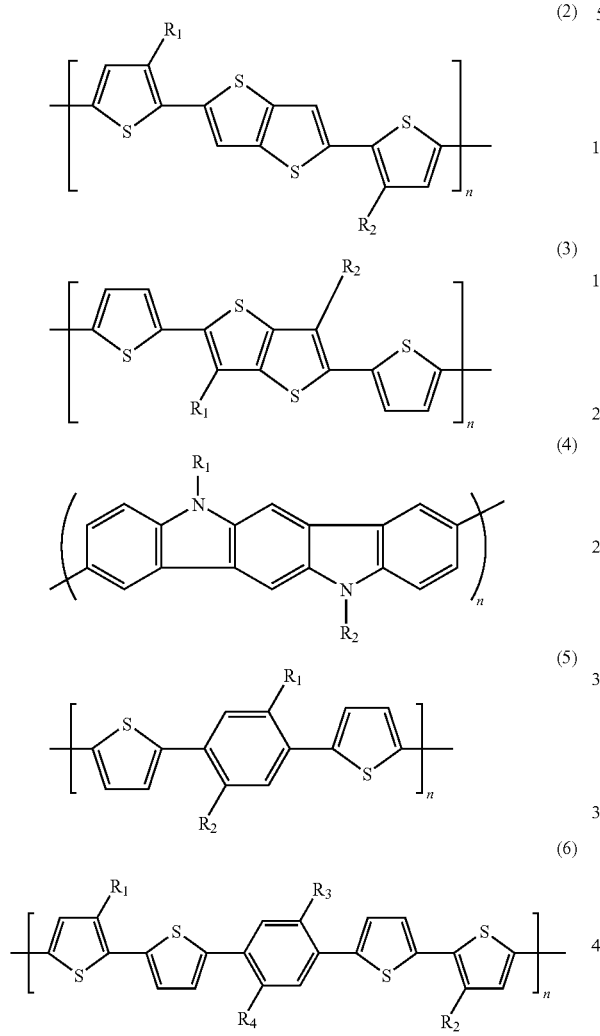

wherein $R_1$, $R_2$, $R_3$ and $R_4$, which are the same or different from each other, are independently selected from the groups consisting of a hydrogen, a hydrocarbon group and a heteroatom-containing group, and n is the degree of polymerization.

For the polymers of structures (1) through (6) with substitutents $R_1$, $R_2$, $R_3$ and $R_4$, the hydrocarbon group, the heteroatom-containing group and the degree of polymerization "n" are now discussed.

The hydrocarbon group may contain for example from 1 to about 25 carbon atoms, or from 1 to about 12 carbon atoms, and may be for example a straight chain alkyl group, a branched alkyl group, a cycloalkyl group, an aryl group, an alkylaryl group, and an arylalkyl group. Exemplary hydrocarbon groups include for example methyl, ethyl, propyl, butyl, pentyl, hexyl, heptyl, octyl, nonyl, decyl, undecyl, dodecyl, tridecyl, tetradecyl, pentadecyl, cyclopentyl, cyclohexyl, cycloheptyl, phenyl, methylphenyl, ethylphenyl, propylphenyl, butylphenyl, pentylphenyl, hexylphenyl, heptylphenyl, octylphenyl, nonylphenyl, decylphenyl, undecylphenyl, dodecylphenyl and isomers thereof.

The heteroatom-containing group may be for example a group containing 2 to about 50 atoms, or from 2 to about 30 atoms and may be for example a nitrogen containing moiety such as pyridyl and 8-aminooctyl, an alkoxy group such as ethoxy and dodecyloxy, a heterocyclic system such as furyl and thienyl, an alkoxyaryl such as dodecyloxyphenyl and octyloxy phenyl, and an arylalkoxy such as 2-phenylethoxy.

The degree of polymerization "n" may be for example from 2 to about 500, preferably from 2 to about 200.

Illustrative examples of gelable semiconductor polymers are for example

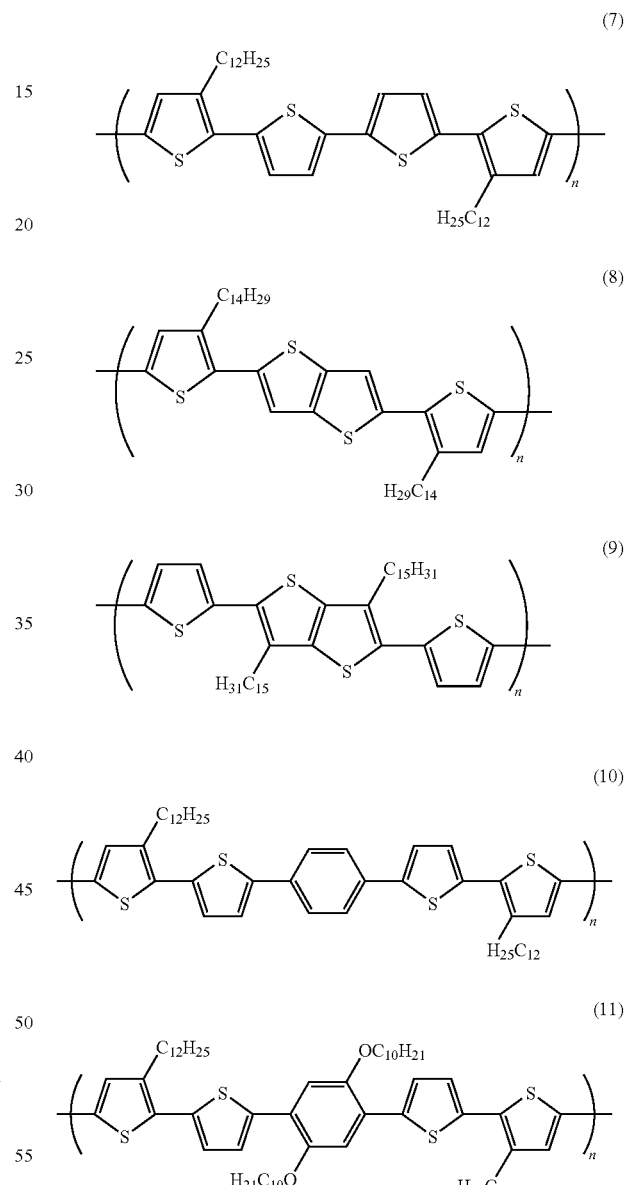

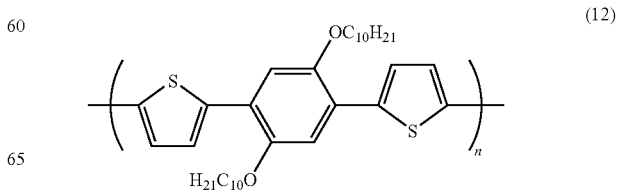

-continued

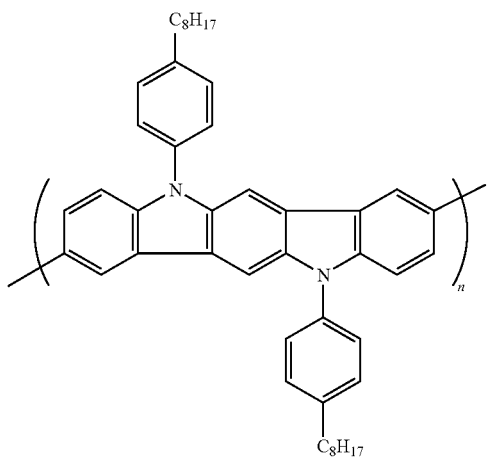

(13)

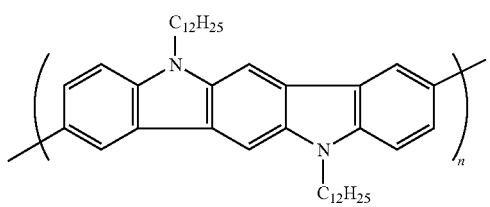

(14)

wherein n is the degree of polymerization for example from 2 to about 200.

Any liquid(s) which can dissolve the gelable semiconductor polymer at room temperature or at an elevated temperature may be used. In order to achieve a thin layer of the polymer (such as for example the dried layer thicknesses described herein), in embodiments, the "low concentration" of the polymer is for instance from about 0.1% to about 5% by weight, especially from about 0.1% to about 1% by weight of the polymer based on the weight of the gelable composition. Since how well a particular polymer can dissolve in the liquid may depend in embodiments on the temperature, for purposes of determining whether a particular polymer is at a "low concentration" encompassed by the concentration ranges disclosed herein, the determination of dissolved polymer concentration is made at room temperature even if an elevated temperature were used to enhance dissolution of the polymer.

As used herein, the phrase "room temperature" refers to a temperature ranging for instance from about 20 to about 25 degrees C.

The liquid may be for instance dichloroethane, chloroform, tetrahydrofuran, chlorobenzene, dichlorobenzene, trichlorobenzene, nitrobenzene, toluene, xylene, mesitylene, 1,2,3,4-tetrahydronaphthelene, dichloromethane, trichloroethane, 1,1,2,2,-chloroethane, dimethyl sulfoxide, and a mixture thereof.

The gelable composition comprises the gelable semiconductor polymer and the liquid. In the gelable composition, the polymer or polymers are completely dissolved or partially dissolved in a liquid at room temperature or at an elevated temperature. Agitation may be optionally employed to aid the dissolution. Undissolved polymer may be optionally removed by filtration.

In embodiments, heat is employed to aid the dissolution of the polymer at an elevated temperature for a period of time ranging for instance from about 1 minutes to about 24 hours, particularly from about 10 minutes to about 4 hours.

As used herein, the phrase "elevated temperature" refers to a temperature ranging from above room temperature to the boiling point or higher of the chosen liquid (at one atmosphere or higher pressure), for example from about 40 to about 180 degrees C., particularly from about 50 to about 120 degrees C.

The gelling methods encompass for example lowering the temperature of the gelable composition, adding a different liquid which is less or not capable of dissolving the polymer compared to the liquid, adding a gelatinizer, and the like. For example, the temperature of the gelable composition is lowered from an elevated temperature to a lower temperature ("lower temperature") to cause gelling of the gelable composition. The lower temperature may be a temperature ranging from below room temperature to below the elevated temperature such as for example from about 10 to about 60 degrees C., particularly from about 20 to about 30 degrees C., and especially at room temperature. In embodiments, the temperature is lowered from the elevated temperature to the lower temperature by an amount ranging for instance from about 10 to about 150 degrees C., particularly from about 20 to about 80 degrees C. To cause gelling, the temperature is maintained at the lower temperature for a time period ranging for example from about 5 seconds to about 1 week, especially from about 10 min to about 1 day, particularly from about 30 minutes to about 4 hours.

In case of adding a different liquid to cause gelling, the different liquid is added in an amount ranging from about 1% to about 80% by volume based on the total volume of the liquid and the different liquid over a period of time ranging for instance from about 1 minute to about 4 hours, particularly from about 10 minutes to about 1 hour. The different liquid may be added at any suitable point such as for example during the dissolution of at least a portion of the polymer in the liquid at the elevated temperature or during the lowering the temperature of the gelable composition from the elevated temperature to the lower temperature or after lowering the gelable composition to the lower temperature. The temperature of the different liquid during its addition to the gelable composition may be the same or different from the temperature of the gelable composition. The different liquid may be for instance methanol, ethanol, isopropanol, hexane, heptane, acetone, water, and mixtures thereof. It is understood that combination of the lowering the temperature and addition of the different liquid may be used together.

A gelatinizer is optionally added to the gelable composition to facilitate gelling. Examples of the gelatinizer include organometallic compounds for example Pt(styrene)$_3$ which is capable of forming complex with semiconductor polymers. The use of gelatinizer is from about 0.001 to about 1 percent by weight of the polymer in the gelable composition. In embodiments, the gelable/gelled/broken gelled compositions are free of a gelatinizer.

The weight of the different liquid (if employed) and gelatinizer (if employed) are not considered during determination of the "low concentration" of the polymer in the gelable composition.

Gelling the gelable composition is accomplished to result in a gelled composition. The gelled composition is not flowable, having a high viscosity for example larger than 3000 centipoise. In the conventional view, gelling is generally undesirable since a gelled composition is impractical to liquid deposit into a thin and uniform semiconductor layer, but the present process unconventionally uses gelling because gelling is an indicator of increased viscosity.

Breaking the gelled composition may be accomplished by any suitable technique to introduce fluidity, resulting in a flowable, broken gelled composition. The term "flowable" indicates a viscosity suitable for liquid deposition of for example less than 3,000 centipoise, particularly less than 1,000 centipoise. In embodiments, agitation is used to break the gelled composition. The agitation is maintained for a sufficient time to break the gelled composition such as an agitation time ranging for example from about 5 minutes to about 20 hours. The intensity of the agitation may be constant or may vary throughout the agitation time. Exemplary agitation methods include for instance, stirring and homogenization with the mixing speed ranging for example from about 1000 rpm to about 5000 rpm, and ultrasonic vibration with a sonicator wattage ranging for example from about 100 W to about 400 W and a sonicator frequency ranging for example from about 20 kHz to about 42 kHz.

The flowable, broken gelled composition may or may not have some gelled material as seen by the naked eye. In embodiments, the flowable, broken gelled composition has a viscosity at least about 10 times higher than the liquid used in the gelable composition. In embodiments, the flowable, broken gelled composition has a viscosity about 10 times to about 100 times higher than the liquid. For viscosity comparisons, the broken gelled composition and the liquid (a single liquid or a mixture of two or more liquids in any suitable ratio) are measured at room temperature using a standard technique. In embodiments, the viscosity is measured with a rheology meter at room temperature. When performing the viscosity comparison, a difference of a few degrees in room temperature (as described herein "room temperature" is a temperature range) between the broken gelled composition and the liquid is permitted since viscosity values are generally not significantly affected by the few degrees difference in room temperature. If available from reference sources, the published viscosity of the liquid at room temperature can be used. For comparison purposes, published viscosities of exemplary liquids are listed in the following table.

| Liquid | Viscosity (centipoise) |
|---|---|
| 1,2-dichlorobenzene | 1.32 at 25° C. |
| Chlorobenzene | 0.8 at 20° C. |
| Toluene | 0.59 at 20° C. |
| ortho-Xylene | 0.81 at 20° C. |
| trichloroethylene | 0.566 at 20° C. |
| Dimethyl sulfoxide | 2.24 at 20° C. |

Any suitable technique may be used to deposit a layer of the flowable, broken gelled composition. In embodiments, liquid depositing may be used. The phrase "liquid depositing" refers to any liquid compatible coating technique such as spin coating, blade coating, rod coating, screen printing, stamping, ink jet printing, and the like. In embodiments, inkjet printing is preferred.

During the depositing the layer of the broken gelled composition, the broken gelled composition is at a deposition temperature. In embodiments, the deposition temperature may be a temperature ranging from below room temperature to below the elevated temperature such as for example from about 10 to about 40 degrees C., particularly from about 20 to about 30 degrees C., and especially at room temperature. The deposition temperature and the lower temperature may be the same or different from one another. Where the deposition temperature and/or the lower temperature are below room temperature, suitable cooling apparatus may be employed to accomplish this. In embodiments, both the deposition temperature and the lower temperature are at room temperature.

The deposited layer of the broken gelled composition is at least partially dried, especially completely dried, using any suitable technique to remove the liquid (and if used the different liquid). When dried, the broken gelled composition preferably forms a continuous film. In embodiments where some gelled material is present in the deposited broken gelled composition, the gels collapse together and coalesce, resulting in the formation of a continuous film. Drying techniques may involve for instance: directing one or more streams of air (at room temperature or at an elevated temperature) at the layer; "natural" evaporation from the layer (i.e., evaporation at room temperature without using an air stream), heating the layer while optionally applying a vacuum, or a combination of drying techniques. In embodiments where heat is employed in the drying technique, the elevated temperature may range for instance from about 40 to about 120 degrees C. at normal or reduced pressures, for a period of time ranging for instance from about 10 minutes to about 24 hours. The dry thickness of the layer is for example from about 5 nanometers to about 1 micrometer or for example from about 10 to about 150 nanometers. In embodiments, the dried layer is a semiconductor layer of an electronic device. The dried semiconductor layer has a thickness for example less than about 500 nm, particularly less than about 100 nm. In embodiments, the semiconductor layer has a thickness of about 50 nm.

In embodiments, the present process may be used whenever there is a need to form a semiconductor layer in an electronic device. The phrase "electronic device" refers to micro- and nano-electronic devices such as, for example, micro- and nano-sized transistors and diodes. Illustrative transistors include for instance thin film transistors, particularly organic field effect transistors. In embodiments, the present process, however, may be used not just in fabricating electronic devices but in any process where there is a need for a low concentration, high viscosity, liquid deposition compatible composition.

In FIG. 1, there is schematically illustrated a thin film transistor ("TFT") configuration 10 comprised of a substrate 16, in contact therewith a metal contact 18 (gate electrode) and a layer of an insulating layer 14 on top of which two metal contacts, source electrode 20 and drain electrode 22, are deposited. Over and between the metal contacts 20 and 22 is an organic semiconductor layer 12 as illustrated herein.

Figure 2:
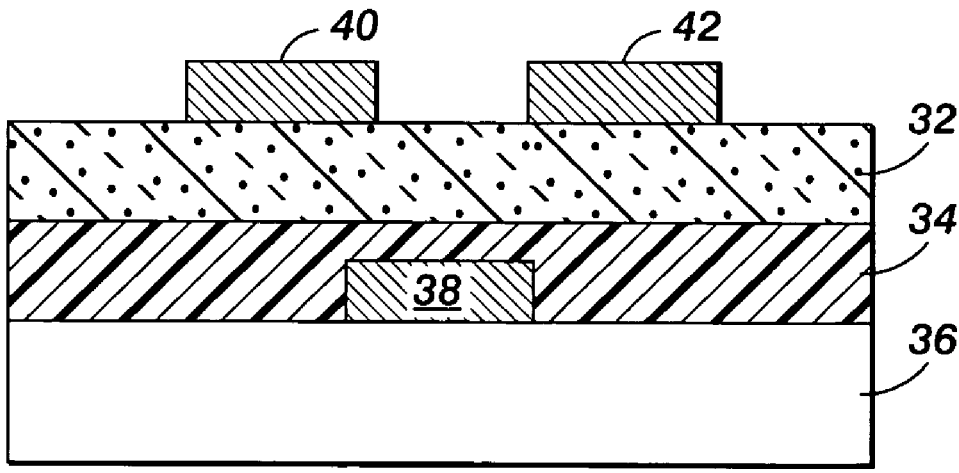
FIG. 2 represents a second embodiment of an OTFT made using the present process.

FIG. 2 schematically illustrates another TFT configuration 30 comprised of a substrate 36, a gate electrode 38, a source electrode 40 and a drain electrode 42, an insulating layer 34, and an organic semiconductor layer 32.

Figure 3:
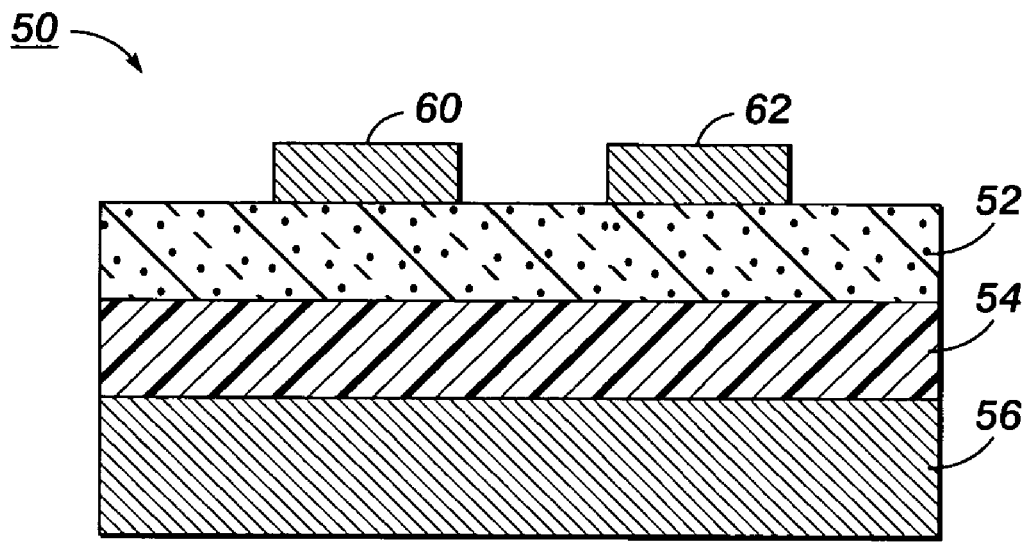
FIG. 3 represents a third embodiment of an OTFT made using the present process.

FIG. 3 schematically illustrates a further TFT configuration 50 comprised of a heavily n-doped silicon wafer 56 which acts as both a substrate and a gate electrode, a thermally grown silicon oxide insulating layer 54, and an organic semiconductor layer 52, on top of which are deposited a source electrode 60 and a drain electrode 62.

Figure 4:
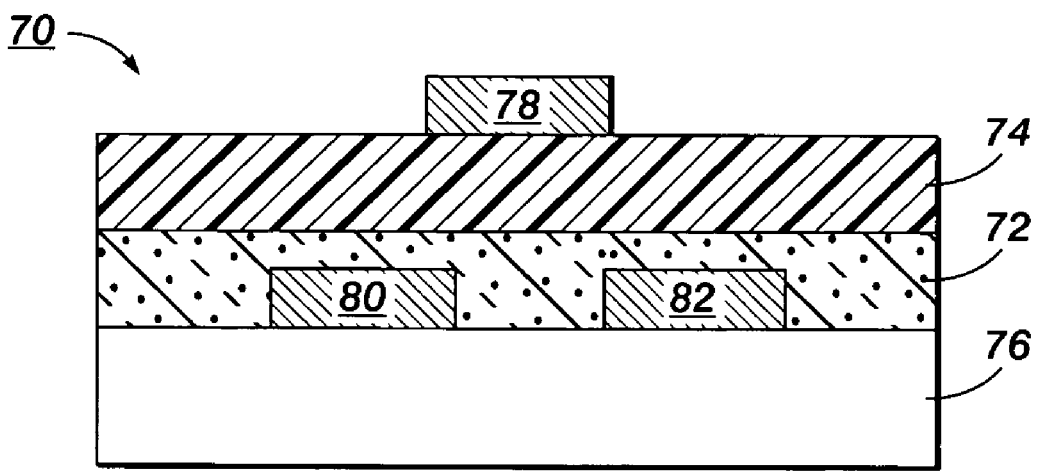
FIG. 4 represents a fourth embodiment of an OTFT made using the present process.

FIG. 4 schematically illustrates an additional TFT configuration 70 comprised of substrate 76, a gate electrode 78, a source electrode 80, a drain electrode 82, an organic semiconductor layer 72, and an insulating layer 74.

The substrate may be composed of for instance silicon, glass plate, plastic film or sheet. For structurally flexible devices, plastic substrate, such as for example polyester, polycarbonate, polyimide sheets and the like may be preferred. The thickness of the substrate may be from about 10 micrometers to over 10 millimeters with an exemplary thickness being from about 50 to about 100 micrometers, especially for a flexible plastic substrate and from about 1 to about 10 millimeters for a rigid substrate such as glass or silicon.

The compositions of the gate electrode, the source electrode, and the drain electrode are now discussed. The gate electrode can be a thin metal film, a conducting polymer film, a conducting film made from conducting ink or paste or the substrate itself, for example heavily doped silicon. Examples of gate electrode materials include but are not restricted to aluminum, gold, chromium, indium tin oxide, conducting polymers such as polystyrene sulfonate-doped poly(3,4-ethylenedioxythiophene) (PSS-PEDOT), conducting ink/paste comprised of carbon black/graphite or colloidal silver dispersion in polymer binders, such as Electrodag available from Acheson Colloids Company. The gate electrode layer can be prepared by vacuum evaporation, sputtering of metals or conductive metal oxides, coating from conducting polymer solutions or conducting inks by spin coating, casting or printing. The thickness of the gate electrode layer ranges for example from about 10 to about 200 nanometers for metal films and in the range of about 1 to about 10 micrometers for polymer conductors. The source and drain electrode layers can be fabricated from materials which provide a low resistance ohmic contact to the semiconductor layer. Typical materials suitable for use as source and drain electrodes include those of the gate electrode materials such as gold, nickel, aluminum, platinum, conducting polymers and conducting inks. Typical thicknesses of source and drain electrodes are about, for example, from about 40 nanometers to about 1 micrometer with the more specific thickness being about 100 to about 400 nanometers.

The insulating layer generally can be an inorganic material film or an organic polymer film. Illustrative examples of inorganic materials suitable as the insulating layer include silicon oxide, silicon nitride, aluminum oxide, barium titanate, barium zirconium titanate and the like; illustrative examples of organic polymers for the insulating layer include polyesters, polycarbonates, poly(vinyl phenol), polyimides, polystyrene, poly(methacrylate)s, poly(acrylate)s, epoxy resin and the like. The thickness of the insulating layer is, for example from about 10 nanometers to about 500 nanometers depending on the dielectric constant of the dielectric material used. An exemplary thickness of the insulating layer is from about 100 nanometers to about 500 nanometers. The insulating layer may have a conductivity that is for example less than about $10^{-12}$ S/cm.

The composition and formation of the semiconductor layer are described herein.

The insulating layer, the gate electrode, the semiconductor layer, the source electrode, and the drain electrode are formed in any sequence where in embodiments the gate electrode and the semiconductor layer both contact the insulating layer, and the source electrode and the drain electrode both contact the semiconductor layer. The phrase "in any sequence" includes sequential and simultaneous formation. For example, the source electrode and the drain electrode can be formed simultaneously or sequentially. The composition, fabrication, and operation of field effect transistors are described in Bao et al., U.S. Pat. No. 6,107,117, the disclosure of which is totally incorporated herein by reference.

The TFT devices contain a semiconductor channel with a width W and length L. The semiconductor channel width may be, for example, from about less than 1 micrometers to about 5 millimeters, with a specific channel width being about 5 micrometers to about 1 millimeter. The semiconductor channel length may be, for example, from about less than 1 micrometer to about 1 millimeter with a more specific channel length being from about 5 micrometers to about 100 micrometers.

The source electrode is grounded and a bias voltage of generally, for example, about 0 volt to about −80 volts is applied to the drain electrode to collect the charge carriers transported across the semiconductor channel when a voltage of generally about +40 volts to about −80 volts is applied to the gate electrode.

The invention will now be described in detail with respect to specific exemplary embodiments thereof, it being understood that these examples are intended to be illustrative only and the invention is not intended to be limited to the materials, conditions, or process parameters recited herein. All percentages and parts are by weight unless otherwise indicated.

EXAMPLE

In this example, a polythiophene having the structural formula (1), wherein $R_1=R_2=n-C_{12}H_{25}$, was used for illustration. The synthesis of the polymer was disclosed previously (U.S. Pat. No. 6,890,868, the disclosure of which is totally incorporated herein by reference).

The polythiophene was dissolved in 1,2-dichlorobenzene at 0.3 wt % level by heating to about 120° C. The solution was filtered through a 0.2 μm syringe filter while it was hot. Yellow to reddish clear solution was obtained. The hot solution was allowed to cool down to room temperature without agitation. A purple gel was formed in half hour. An ultrasonic vibration was then applied to the purple gel with a 100 W sonicator at 42 kHz for 10 to 15 minutes. A flowable, broken gelled composition was obtained.

Viscosity of the purple flowable, broken gelled composition was measured at a frequency of 1 Hz. Viscosity of 40 centipoise was observed at room temperature. The broken gelled composition has a viscosity about 30 times higher than that of the liquid (1,2-dichlorobenzene) at room temperature.

A top-contact thin film transistor structure, as schematically described by FIG. 3, was chosen as the primary test device configuration. The test device was comprised of an n-doped silicon wafer with a thermally grown silicon oxide layer of a thickness of about 200 nanometers thereon. The wafer functioned as the gate electrode while the silicon oxide layer acted as the insulating layer and had a capacitance of about 15 nF/cm² (nanofarads/square centimeter). The fabrication of the device was accomplished under ambient conditions without any precautions being taken to exclude the materials and device from exposure to ambient oxygen, moisture, or light. The silicon wafer was first cleaned with argon plasma, isopropanol, air dried, and then immersed in a 0.1 M solution of octyltrichlorosilane in toluene for about 20 minutes at room temperature. Subsequently, the wafer washed with toluene, isopropanol and air-dried. The above flowable, broken gelled composition was spin coated on the modified silicon wafer at 1000 rpm for 120 seconds, resulting in a very homogenous semiconductor polythiophene layer of about 30 nanometers in thickness. After dried and annealed in vacuo at 80-140° C., gold electrodes were vacuum evaporated on top of the semiconductor layer through a shadow mask to complete the devices.

The evaluation of field-effect transistor performance was accomplished in a black box at ambient conditions using a Keithley 4200 SCS semiconductor characterization system.

The carrier mobility, μ, was calculated from the data in the saturated regime (gate voltage, $V_G$<source-drain voltage, $V_{SD}$) accordingly to equation (1)

$$I_{SD}=C_i\mu(W/2L)(V_G-V_T)^2 \quad (1)$$

where $I_{SD}$ is the drain current at the saturated regime, W and L are, respectively, the semiconductor channel width and length, $C_i$ is the capacitance per unit area of the insulating layer, and $V_G$ and $V_T$ are, respectively, the gate voltage and threshold voltage. $V_T$ of the device was determined from the relationship between the square root of $I_{SD}$ at the saturated regime and $V_G$ of the device by extrapolating the measured data to $I_{SD}$=0.

Transistors with dimensions of W (width)=5,000 μm and L (length)=90 μm were measured. A mobility of 0.1-0.18 cm²/V.s and current on/off ratio about $10^7$ were achieved. Devices made from this high viscosity, low concentration, broken gelled composition showed very good reproducibility and uniformity.

It will be appreciated that various of the above-disclosed and other features and functions, or alternatives thereof, may be desirably combined into many other different systems or applications. Various presently unforeseen or unanticipated alternatives, modifications, variations or improvements therein may be subsequently made by those skilled in the art which are also intended to be encompassed by the following claims. Unless specifically recited in a claim, steps or components of claims should not be implied or imported from the specification or any other claims as to any particular order, number, position, size, shape, angle, color, or material.

The invention claimed is:

1. A process comprising:
   (a) providing a gelable composition comprising a gelable semiconductor polymer and a liquid, wherein the polymer is at a low concentration in the liquid;
   (b) gelling the gelable composition to result in a gelled composition;
   (c) breaking the gelled composition to result in a flowable, broken gelled composition, wherein the viscosity of the flowable, broken gelled composition is at least about 10 times greater than the viscosity of the liquid; and
   (d) liquid depositing the flowable, broken gelled composition.

2. The composition of claim 1, wherein the flowable, broken gelled composition is free of a gelatinizer.

3. The process of claim 1, wherein the gelable semiconductor polymer is selected from the group consisting of:

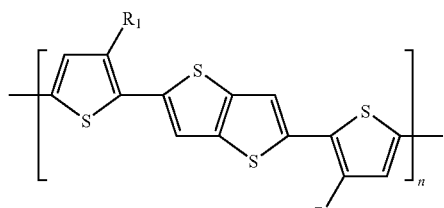

(2)

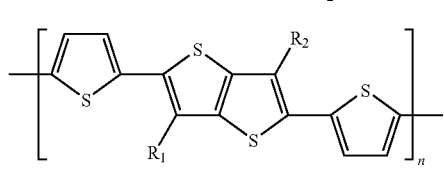

(3)

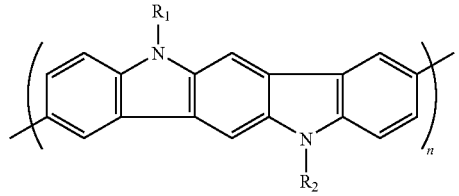

(4)

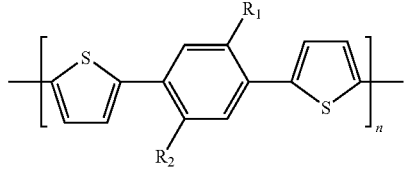

(5)

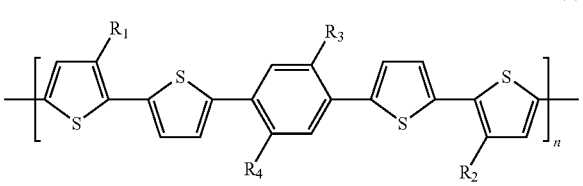

(6)

and mixtures thereof, wherein $R_1$, $R_2$, $R_3$ and $R_4$ are independently selected from hydrogen, alkyl, cycloalkyl, aryl, alkylaryl, arylalkyl, a nitrogen containing moiety, alkoxy, a heterocyclic system, alkoxyaryl, and arylalkoxy; and n is the degree of polymerization and is from 2 to about 200.

4. The process of claim 1, wherein the gelable composition further comprises a gelatinizer.

5. The process of claim 1, wherein the gelled composition has a viscosity of greater than 3000 centipoise.

6. A process to fabricate a semiconductor layer comprising:
   (a) gelling a gelable composition comprising a gelable semiconductor polymer and a liquid, wherein the polymer is at a low concentration in the liquid, to form a gelled composition having a viscosity of greater than 3,000 centipoise;
   (b) breaking the gelled composition to obtain a flowable, broken gelled composition having a viscosity at least about 10 times greater than the viscosity of the liquid;
   (c) liquid depositing a layer of the flowable, broken gelled composition upon a substrate; and
   (d) drying the deposited layer to result in the semiconductor layer.

7. The process of claim 6, wherein the low concentration of the gelable semiconductor polymer corresponds to about 0.1% to about 5% by weight of the polymer.

8. The process of claim 6, wherein the low concentration of the gelable semiconductor polymer corresponds to about 0.1% to about 1% by weight of the polymer.

9. The process of claim 6, wherein the viscosity of the flowable, broken gelled composition is about 10 to 100 times greater than the viscosity of the liquid.

10. The process of claim 6, wherein the gelable semiconductor polymer is selected from the group consisting of polythiophenes, triarylamine polymers, polyindolocarbazoles, and a mixture thereof.

11. A process comprising:
    (a) providing a gelable composition comprising a gelable semiconductor polymer and a liquid, wherein the polymer is at a low concentration in the liquid;

(b) gelling the gelable composition to result in a gelled composition having a viscosity greater than 3,000 centipoise;

(c) breaking the gelled composition to result in a flowable, broken gelled composition, wherein the viscosity of the flowable, broken gelled composition is at least about 10 times greater than the viscosity of the liquid; and (d) liquid depositing the flowable, broken gelled composition.

12. The process of claim 11, wherein the low concentration of the gelable semiconductor polymer corresponds to about 0.1% to about 5% by weight of the polymer.

13. The process of claim 11, wherein the low concentration of the gelable semiconductor polymer corresponds to about 0.1% to about 1% by weight of the polymer.

14. The process of claim 11, wherein the viscosity of the flowable, broken gelled composition is about 10 to 100 times greater than the viscosity of the liquid.

15. The process of claim 11, wherein the gelable semiconductor polymer forms interdigitation between polymer chains.

16. The process of claim 11, wherein the gelable semiconductor polymer is selected from the group consisting of polythiophenes, triarylamine polymers, polyindolocarbazoles, and a mixture thereof.

17. The process of claim 11, wherein the gelable semiconductor polymer is selected from the group consisting of:

(1)
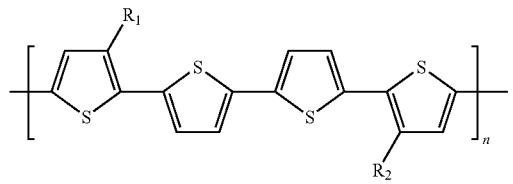

(2)
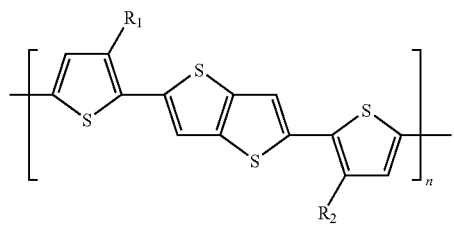

(3)
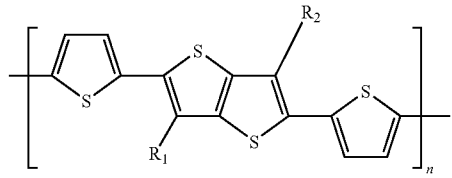

(4)
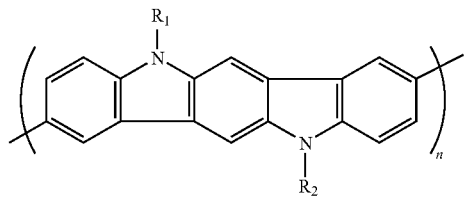

(5)
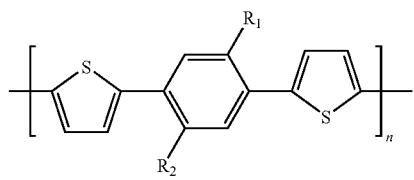

(6)
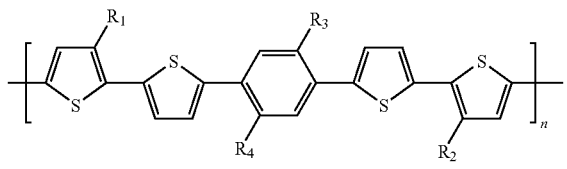

and a mixture thereof, wherein $R_1$, $R_2$, $R_3$ and $R_4$, which are the same or different from each other, are independently selected from the groups consisting of a hydrogen, a hydrocarbon group and a heteroatom-containing group, and n is the degree of polymerization from 2 to about 200.

18. The process of claim 11, wherein the gelling occurs in the absence of agitation of the gelable composition.

* * * * *

UNITED STATES PATENT AND TRADEMARK OFFICE
CERTIFICATE OF CORRECTION

| | | |
|---|---|---|
| PATENT NO. | : 7,790,498 B2 | Page 1 of 1 |
| APPLICATION NO. | : 11/406619 | |
| DATED | : September 7, 2010 | |
| INVENTOR(S) | : Yiliang Wu et al. | |

It is certified that error appears in the above-identified patent and that said Letters Patent is hereby corrected as shown below:

In the Specification:

Column 1, line 8, after "Cooperative Agreement No.", please delete "70NANBOH3033" and insert --70NANB0H3033--.

Signed and Sealed this
Tenth Day of September, 2013

Teresa Stanek Rea
*Acting Director of the United States Patent and Trademark Office*